US012684907B2

(12) United States Patent
Park et al.

(10) Patent No.: US 12,684,907 B2
(45) Date of Patent: Jul. 14, 2026

(54) DISPLAY DEVICE AND METHOD OF MANUFACTURING THE SAME

(71) Applicant: Samsung Display Co., Ltd., Yongin-si (KR)

(72) Inventors: Kyunghoon Park, Yongin-si (KR); Donghoon Yi, Yongin-si (KR); Inseon Lee, Yongin-si (KR); Jaeseol Cho, Yongin-si (KR); Yongsuk Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 391 days.

(21) Appl. No.: 18/392,064

(22) Filed: Dec. 21, 2023

(65) Prior Publication Data

US 2024/0213405 A1     Jun. 27, 2024

(30) Foreign Application Priority Data

Dec. 22, 2022     (KR) ........................ 10-2022-0182340

(51) Int. Cl.
| | |
|---|---|
| *H10H 20/819* | (2025.01) |
| *H10H 20/01* | (2025.01) |
| *H10H 20/831* | (2025.01) |
| *H10H 20/851* | (2025.01) |
| *H10H 20/857* | (2025.01) |

(52) U.S. Cl.
CPC .......... *H10H 20/819* (2025.01); *H10H 20/01* (2025.01); *H10H 20/831* (2025.01); *H10H 20/851* (2025.01); *H10H 20/857* (2025.01); *H10H 20/0364* (2025.01)

(58) Field of Classification Search
CPC .... H10H 20/819; H10H 20/01; H10H 20/831; H10H 20/851; H10H 20/857; H10H 20/0364; H10H 29/142; H10H 20/032; H10H 20/034; H10H 20/036; H10H 20/83; H10K 59/131; H10K 59/122; H10K 59/123; H10K 59/80515; H10K 59/1201; H10D 86/0231; H10D 86/481; H10D 86/60; H10D 86/441; H10W 90/00
See application file for complete search history.

(56) References Cited

U.S. PATENT DOCUMENTS

| | | | |
|---|---|---|---|
| 2013/0168655 A1 | 7/2013 | Yun et al. | |
| 2017/0256597 A1* | 9/2017 | Lee ...................... | H10K 59/873 |
| 2021/0202653 A1 | 7/2021 | Cho et al. | |
| 2023/0225168 A1 | 7/2023 | Park et al. | |

FOREIGN PATENT DOCUMENTS

| | | |
|---|---|---|
| CN | 113972252 A | 1/2022 |
| KR | 20180041796 A | 4/2018 |
| KR | 20210035358 A | 4/2021 |

OTHER PUBLICATIONS

Extended European Search Report mailed May 23, 2024 in EP Application No. 23217269.2, 8 pages.

* cited by examiner

*Primary Examiner* — Mohammad A Rahman
(74) *Attorney, Agent, or Firm* — CANTOR COLBURN LLP

(57) ABSTRACT

A display device includes a via pattern having a first height in a first area and a second height in a second area, wherein the second height is lower than the first height, a pixel electrode contacting the connection electrode in the second area, and a pixel defining pattern disposed on the pixel electrode and accommodated in the via pattern to overlap the second area.

20 Claims, 15 Drawing Sheets

DISPLAY DEVICE AND METHOD OF MANUFACTURING THE SAME

This application claims priority to Korean Patent Application No. 10-2022-0182340, filed on Dec. 22, 2022, and all the benefits accruing therefrom under 35 U.S.C. § 119, the content of which in its entirety is herein incorporated by reference.

BACKGROUND

1. Field

Implementations of the inventive concept relate generally to a display device and a method of manufacturing the display device.

2. Description of the Related Art

A display device includes a pixel circuit and a light emitting diode, wherein the pixel circuit generates a driving current, and the light emitting diode emits light corresponding to the driving current. To implement the pixel circuit and the light emitting diode, the display device has a stack structure in which various patterns are stacked.

Meanwhile, a foreign material may be generated in the manufacturing process of the display device. Cracks may occur in the patterns or dark spots may occur in the display device due to the foreign material, and thus, the yield of the display device may decrease.

The foreign material may be removed through a cleaning process. However, when the foreign material is positioned at the boundary of the patterns, there is a problem in that the foreign material is not easily removed due to a step difference formed by the patterns.

SUMMARY

Embodiments provide a display device with improved yield.

Embodiments provide a method of manufacturing the display device.

A display device according to an embodiment may include a connection electrode disposed on a substrate, a via pattern disposed on the connection electrode, having a first height in a first area, and having a second height lower than the first height in a second area surrounding the first area, a pixel electrode disposed on the via pattern and contacting the connection electrode in the second area, and a pixel defining pattern disposed on the pixel electrode and accommodated in the via pattern overlapping the second area.

In an embodiment, the first area may have a polygonal shape, and the second area may completely surround the first area along the edge of the first area.

In an embodiment, the first area may have an octagonal shape.

In an embodiment, the via pattern may include a first upper surface having the first height and a second upper surface having the second height. An upper surface of the pixel electrode contacting the connection electrode may be positioned lower than the second upper surface.

In an embodiment, the pixel electrode may contact the connection electrode through a contact hole penetrating the via pattern, and the contact hole may be defined in a portion of the second area.

In an embodiment, the pixel defining pattern may have a curvature, and a maximum height of the pixel defining pattern may be higher than the first height.

In an embodiment, the pixel defining pattern may have the first height and may be flatly accommodated in the via pattern.

In an embodiment, the pixel defining pattern may have a height higher than the first height and may be flatly accommodated in the via pattern.

In an embodiment, the display device may further include a common emission layer disposed on the pixel electrode and the pixel defining pattern.

In an embodiment, the display device may further include a lower metal pattern disposed on the substrate and an active pattern disposed on the lower metal pattern.

In an embodiment, the display device may further include a conversion substrate positioned to face the substrate.

A method of manufacturing a display device according to an embodiment may include forming a connection electrode on a substrate, forming a via layer on the connection electrode, wherein the via layer includes a first area and a second area surrounding the first area, forming a contact hole penetrating the via layer to expose the connection electrode in the second area, forming a via pattern such that a first height of the first area is higher than a second height of the second area, by partially removing the via layer, forming a pixel electrode contacting the connection electrode in the second area, and forming a pixel defining pattern accommodated in the via pattern overlapping the second area.

In an embodiment, the contact hole and the via pattern may be formed together.

In an embodiment, the via pattern may be formed using a halftone mask.

In an embodiment, the halftone mask may include a blocking area corresponding to the first area, an open area corresponding to the contact hole, and a halftone area corresponding to the second area.

In an embodiment, forming the pixel defining pattern may include forming a pixel defining layer to entirely cover the pixel electrode on the via pattern and forming an opening exposing the pixel electrode of the first area in the pixel defining layer.

In an embodiment, the method may further include forming a common emission layer on the pixel electrode and the pixel defining pattern.

In an embodiment, the method may further include bonding a color conversion substrate to face the substrate.

A display device according to embodiments may include a via pattern and a pixel defining pattern. The via pattern may have a first height in a first area and a second height lower in a second area, wherein the second height is lower than the first height. In other words, the via pattern may include upper surfaces having different heights, and a first upper surface of the first area may be higher than a second upper surface of the second area. Accordingly, an accommodation space may be formed in the via pattern of the second area.

In an embodiment, the pixel defining pattern may be accommodated in the via pattern to overlap the second area. In other words, the pixel defining pattern may be accommodated in the accommodating space. Accordingly, the pixel defining pattern may have a sufficient thickness in the accommodation space, and a step difference between the via pattern and the pixel defining pattern may be reduced.

In an embodiment, a display device which includes a connection electrode disposed on a substrate, a via pattern disposed on the connection electrode, wherein the via pattern includes a first height in a first area and a second height in a second area, wherein the second area surrounds the first area and wherein the second height is lower than the first height. The display device includes a pixel electrode disposed on the via pattern and contacting the connection electrode in the second area, a pixel defining pattern disposed on the pixel electrode and disposed in the via pattern overlapping the second area, wherein the first area is completely surrounded by the second area and wherein the first area is at least one of, a polygonal shape, and an octagonal shape.

In an embodiment, a foreign material generated in a process of manufacturing the display device may be positioned around the pixel defining pattern. In this case, as a step difference between the via pattern and the pixel defining pattern is reduced and the foreign material positioned around the pixel defining pattern may be easily removed.

In an embodiment, a halftone mask may be used to manufacture the via pattern. The halftone mask may include a blocking area, a halftone area, and an open area, and upper surfaces having different heights and contact holes which are formed in the via pattern may be formed together. Accordingly, a process of manufacturing the display device may be shortened.

BRIEF DESCRIPTION OF THE DRAWINGS

The above and other features of embodiments of the disclosure will become apparent by describing in detail embodiments thereof with reference to the accompanying drawings.

FIG. 7 is a cross-sectional view illustrating a method of manufacturing the display device of FIG. 6 according to an embodiment.

FIG. 9 is a cross-sectional view illustrating a method of manufacturing the display device of FIG. 6 according to an embodiment.

FIG. 15 is a cross-sectional view illustrating a display device according to another embodiment.

FIG. 16 is a cross-sectional view illustrating a display device according to still another embodiment.

DETAILED DESCRIPTION

Figure 1:
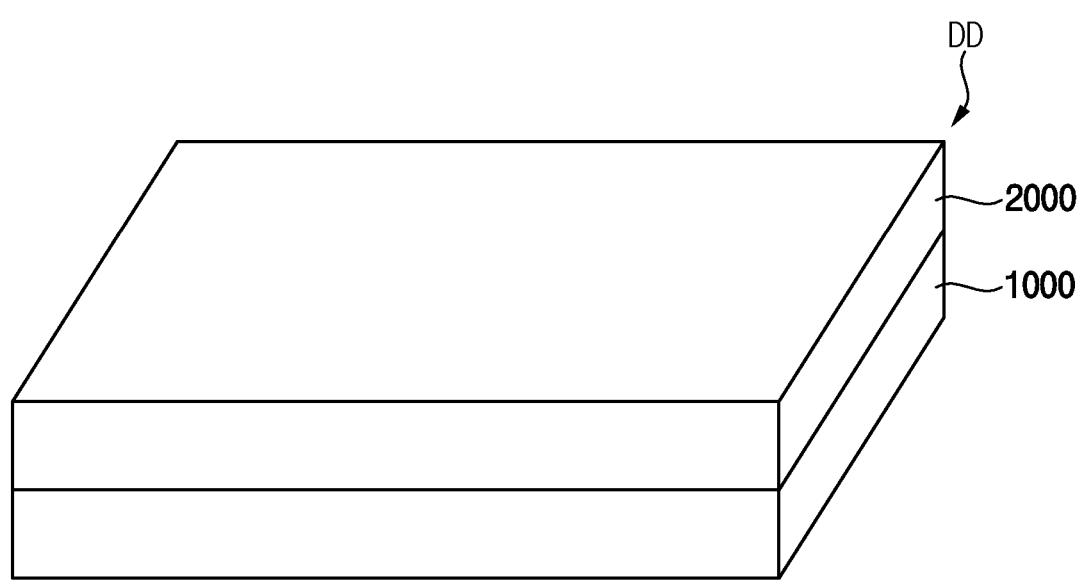
FIG. 1 is a perspective view illustrating a display device according to an embodiment.
Figure 1:
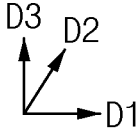

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art, where like reference numerals refer to like elements throughout.

Figure 2:
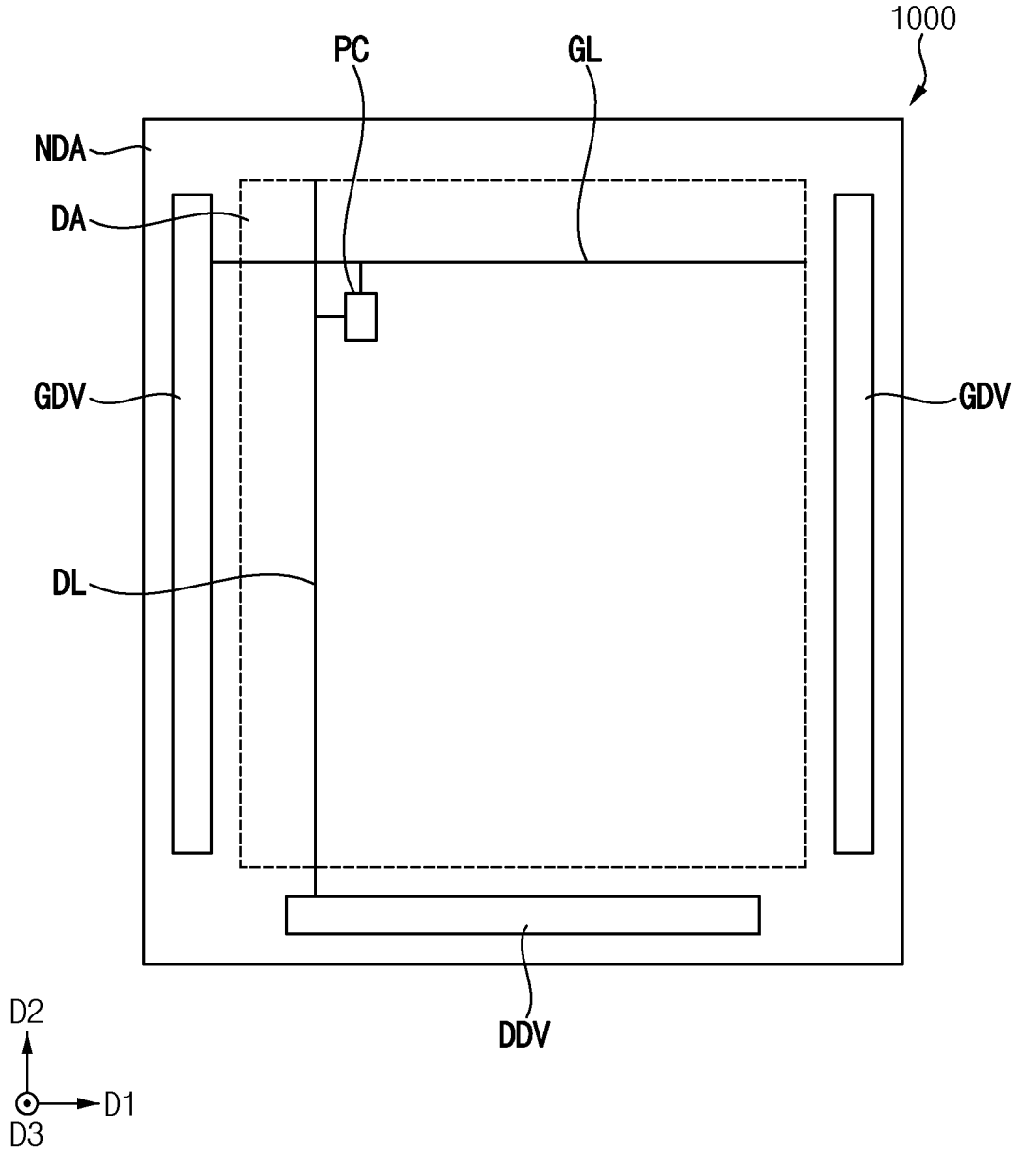
FIG. 2 is a plan view illustrating an emission substrate included in the display device of FIG. 1 according to an embodiment.
Figure 3:
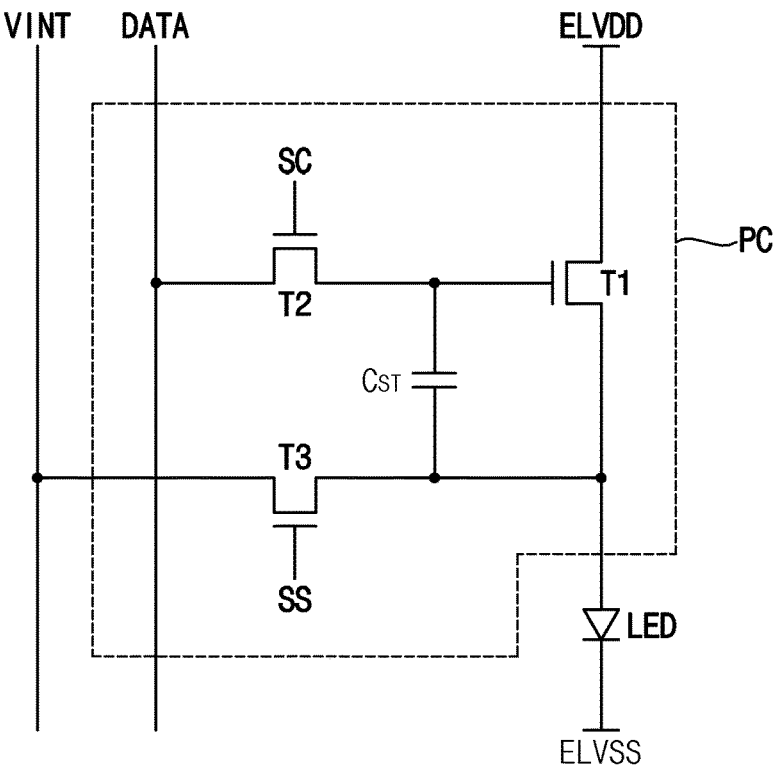
FIG. 3 is a circuit diagram illustrating a pixel circuit included in the emission substrate of FIG. 2 according to an embodiment.

FIG. 1 is a perspective view illustrating a display device according to an embodiment. FIG. 2 is a plan view illustrating an emission substrate included in the display device of FIG. 1. FIG. 3 is a circuit diagram illustrating a pixel circuit included in the emission substrate of FIG. 2.

Referring to FIG. 1, a display device DD according to an embodiment may include an emission substrate 1000 and a color conversion substrate 2000.

The emission substrate 1000 may generate and emit light. In an embodiment, the emission substrate 1000 may include at least one pixel circuit and at least one light emitting diode, wherein the pixel circuit may generate a driving current, and the light emitting diode may emit light corresponding to the driving current.

In an embodiment, the color conversion substrate 2000 may be disposed on the emission substrate 1000. The color conversion substrate 2000 may convert, transmit, block, and/or absorb the color of light that is emitted from the emission substrate 1000. Accordingly, the color conversion substrate 2000 may improve color reproducibility of the display device DD.

In an embodiment, the display device DD may be manufactured by manufacturing the emission substrate 1000 and the color conversion substrate 2000 and by bonding the color conversion substrate 2000 to the emission substrate 1000 such that the color conversion substrate 2000 faces the emission substrate 1000.

In an embodiment and referring to FIG. 2, the emission substrate 1000 may be divided into a display area DA and a non-display area NDA. An image may be displayed in the display area DA, and the non-display area NDA may be positioned to surround at least a portion of the display area DA.

In an embodiment, a pixel circuit PC may be disposed in the display area DA. The pixel circuit PC may be electrically connected to a gate line GL which extends in a first direction D1 and a data line DL which extends in a second direction D2 which crosses the first direction. The pixel circuit PC may generate the driving current.

A gate driver GDV and a data driver DDV may be disposed in the non-display area NDA.

In an embodiment, the gate driver GDV may generate a gate signal, where the gate signal may be transmitted to the pixel circuit PC through the gate line GL.

In an embodiment, the data driver DDV may generate a data voltage, where the data voltage may be transmitted to the pixel circuit PC through the data line DL.

In an embodiment and referring to FIG. 3, the pixel circuit PC may include a first transistor T1, a second transistor T2, a third transistor T3, and a storage capacitor $C_{ST}$. The pixel circuit PC may be electrically connected to the light emitting diode LED. The pixel circuit PC may generate the driving current, and the light emitting diode LED may emit light in response to the driving current.

In an embodiment, the first transistor T1 may include a gate terminal, a first terminal, and a second terminal. The gate terminal may be electrically connected to the second transistor T2. The first terminal may receive a first voltage ELVDD. The second terminal may be electrically connected to the light emitting diode LED. The first transistor T1 may generate the driving current.

In an embodiment, the second transistor T2 may include a gate terminal, a first terminal, and a second terminal. The gate terminal may receive a first gate signal SC. The first terminal may receive a data voltage DATA. The second terminal may be electrically connected to the first transistor T1. The second transistor T2 may transmit the data voltage DATA to the first transistor T1 in response to the first gate signal SC.

In an embodiment, the third transistor T3 may include a gate terminal, a first terminal, and a second terminal. The gate terminal may receive the second gate signal SS. The first terminal may receive an initialization voltage VINT. The second terminal may be electrically connected to the light emitting diode LED. The third transistor T3 may transmit the initialization voltage VINT to the light emitting diode LED and the second terminal of the first transistor T1 in response to the second gate signal SS.

In an embodiment, the storage capacitor CST may include a first terminal and a second terminal, where the first terminal may be electrically connected to the gate terminal of the first transistor T1 and the second terminal may be electrically connected to the second terminal of the first transistor T1.

In an embodiment, the light emitting diode LED may include a first terminal and a second terminal. The first terminal may be electrically connected to the first transistor T1 and the second terminal may receive a second voltage ELVSS.

Figure 4:
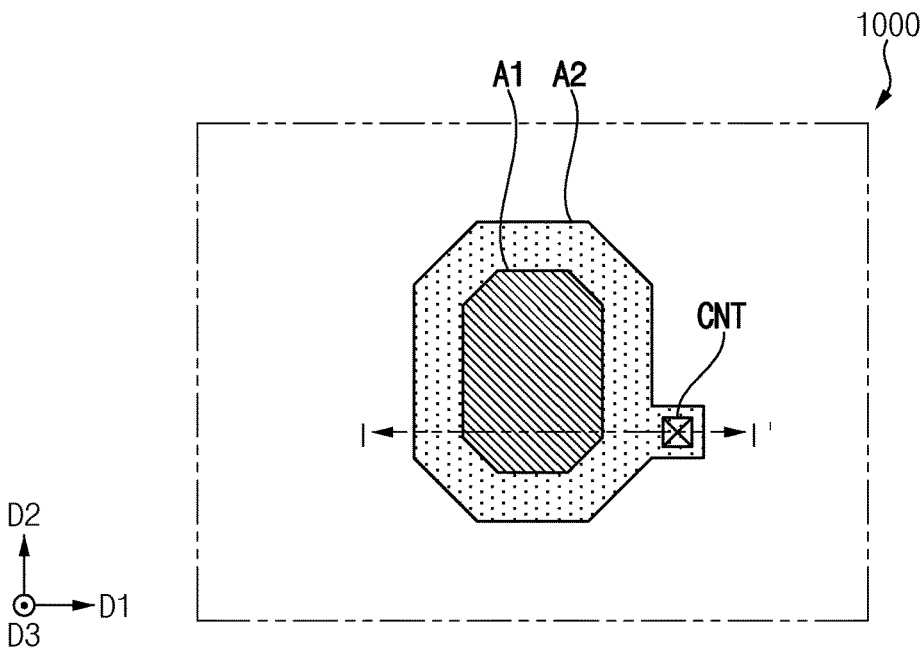
FIG. 4 is an enlarged view illustrating the emission substrate of FIG. 2 according to an embodiment.
Figure 5:
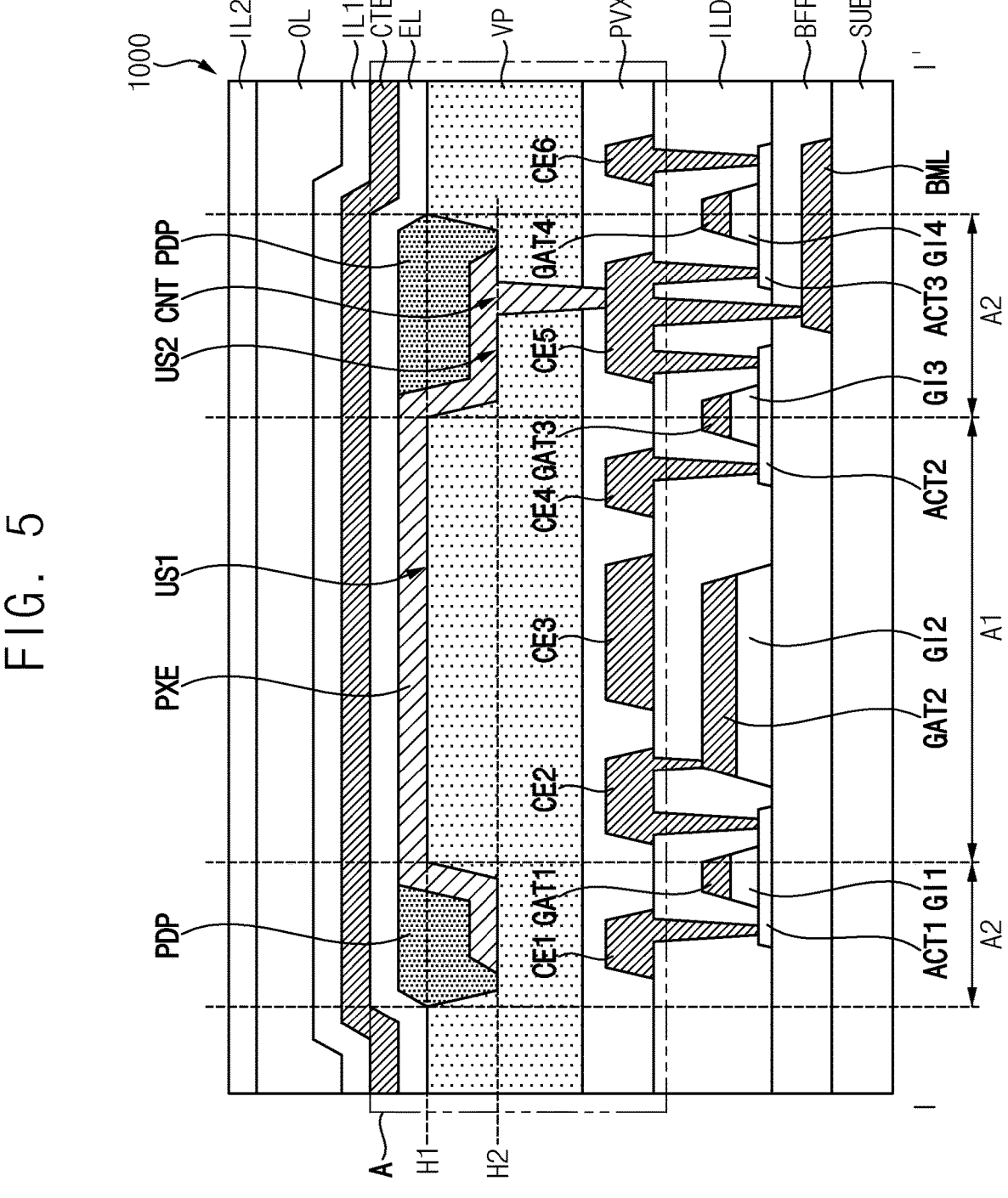
FIG. 5 is a cross-sectional view taken along line I-I' of FIG. 4 according to an embodiment.
Figure 6:
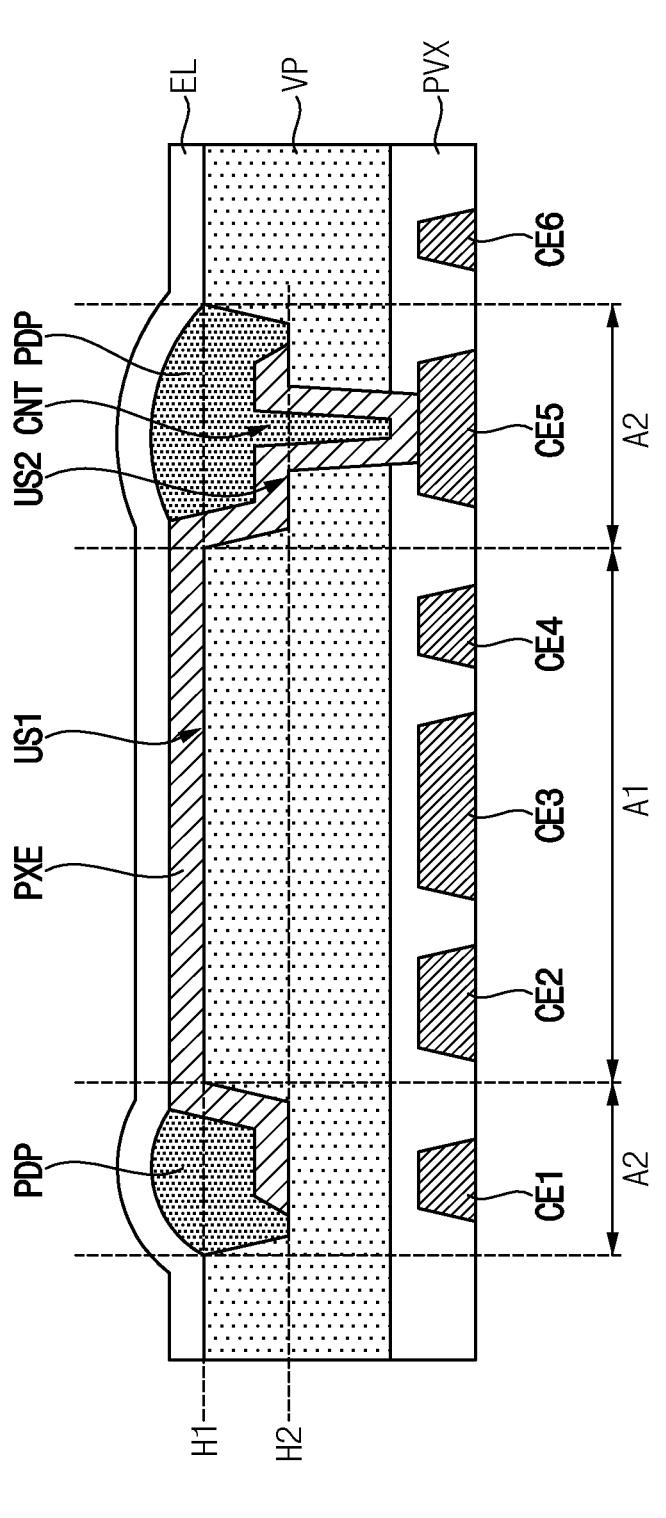
FIG. 6 is an enlarged view of area A of FIG. 5 according to an embodiment.

FIG. 4 is an enlarged view illustrating the emission substrate of FIG. 2 according to an embodiment. FIG. 5 is a cross-sectional view taken along line I-I' of FIG. 4 according to an embodiment. FIG. 6 is an enlarged view of area A of FIG. 5 according to an embodiment.

In an embodiment and referring to FIG. 4, the emission substrate 1000 may include at least one first area A1 and at least one second area A2. For example, the first area A1 may be an area where the pixel electrode is exposed and contacts the common emission layer, and the second area A2 may be an area where an end of the pixel electrode is covered by a pixel-defining pattern. Although one first area A1 and one second area A2 are shown in FIG. 4, the emission substrate 1000 may include a plurality of first areas A1 and a plurality of second areas A2 that are repeatedly arranged.

In an embodiment, the first area A1 may have a polygonal shape, and the second area A2 may completely surround the first area A1 along edge of the first area A1. For example, as shown in FIG. 4, the first area A1 may have an octagonal shape, but the invention is not limited thereto.

In an embodiment, the pixel electrode may be disposed in the first area A1 and the second area A2, and the pixel electrode may contact a connection electrode that is disposed below the pixel electrode through a contact hole CNT.

In an embodiment and referring to FIG. 5, the emission substrate 1000 may include a substrate SUB, a lower metal pattern BML, a buffer layer BFR, first to third active patterns ACT1, ACT2, and ACT3, respectively, first to fourth gate insulating layers GI1, GI2, GI3, and GI4, respectively, first to fourth gate electrodes GAT1, GAT2, GAT3, and GAT4, respectively, an interlayer insulating layer ILD, first to sixth connection electrodes CE1, CE2, CE3, CE4, CE5, and CE6, respectively, a passivation layer PVX, a via pattern VP, a pixel electrode PXE, a pixel defining pattern PDP, a common emission layer EL, a common electrode CTE, a first inorganic layer IL1, an organic layer OL, and a second inorganic layer IL2.

In an embodiment, the substrate SUB may include a transparent or opaque material. In an embodiment, examples of materials that can be used as the substrate SUB may include glass, quartz, plastic, and the like. These may be used alone or in combination with each other. In addition, the substrate SUB may be composed of a single layer or multiple layers in combination with each other.

In an embodiment, the lower metal pattern BML may be disposed on the substrate SUB. In an embodiment, the lower metal pattern BML may be formed of a metal, an alloy, a conductive metal oxide, a transparent conductive material, and/or the like. Examples of materials that can be used as the lower metal pattern BML may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. These may be used alone or in combination with each other. In addition, the lower metal pattern BML may be formed as a single layer and/or as multiple layers in combination with each other.

In an embodiment, the buffer layer BFR may be disposed on the substrate SUB and may cover the lower metal pattern BML. In an embodiment, the buffer layer BFR may be formed of an inorganic insulating material. Examples of materials that can be used as the inorganic insulating material may include silicon oxide, silicon nitride, and/or silicon oxynitride. These may be used alone or in combination with each other. The buffer layer BFR may prevent diffusion of metal atoms and/or atoms and/or impurities from the substrate SUB into the first to third active patterns ACT1, ACT2, and ACT3, respectively. In addition, the buffer layer BFR may control a heat supply rate during a crystallization process for forming the first to third active patterns ACT1, ACT2, and ACT3, respectively.

In an embodiment, the first to third active patterns ACT1, ACT2, and ACT3, respectively, may be disposed on the buffer layer BFR. In an embodiment, the first to third active patterns ACT1, ACT2, and ACT3, respectively, may be formed of a silicon semiconductor material and/or an oxide semiconductor material. Examples of the silicon semiconductor material that can be used for the first to third active patterns ACT1, ACT2, and ACT3, respectively, may include amorphous silicon and/or polycrystalline silicon. Examples of the oxide semiconductor material that can be used for the first to third active patterns ACT1, ACT2, and ACT3, respectively, may include IGZO (InGaZnO) and/or ITZO (InSnZnO). In addition, the oxide semiconductor material may further includes indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and/or zinc ("Zn"). These may be used alone or in combination with each other.

In an embodiment, the first to fourth gate insulating layers GI1, GI2, GI3, and GI4, respectively, may be disposed on the first to third active patterns ACT1, ACT2, and ACT3, respectively, and/or the buffer layer BFR. In an embodiment, the first to fourth gate insulating layers GI1, GI2, GI3, and GI4, respectively, may be formed of an insulating material. Examples of insulating materials that may be used for the first to fourth gate insulating layers GI1, GI2, GI3, and GI4, respectively, may include silicon oxide, silicon nitride, and/or silicon oxynitride. These may be used alone or in combination with each other.

In an embodiment, the first to third gate electrodes GAT1, GAT2, and GAT3, respectively, may be disposed on the first, second, and third gate insulating layers GI1, GI2, and GI3, respectively. In an embodiment, the first to third gate electrodes GAT1, GAT2, and GAT3, respectively, may be formed of metal, alloy, conductive metal oxide, transparent conductive material, and/or the like. Examples of materials that can be used for the first to third gate electrodes GAT1, GAT2, and GAT3, respectively, may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. These may be used alone or in combination with each other.

In an embodiment, the first to third gate electrodes GAT1, GAT2, and GAT3, respectively, may be configured as a single layer and/or as multiple layers in combination with each other. For example, the first to third gate electrodes GAT1, GAT2, and GAT3, respectively, may include a titanium layer and/or a copper layer disposed on the titanium layer. In other words, the first to third gate electrodes GAT1, GAT2, and GAT3, respectively, may have a Ti/Cu structure.

In an embodiment, the interlayer insulating layer ILD may be disposed on the buffer layer BFR, where the interlayer insulating layer ILD may cover the first to third gate electrodes GAT1, GAT2, and GAT3, respectively. In an embodiment, the interlayer insulating layer ILD may be formed of an insulating material. Examples of insulating materials that can be used as the interlayer insulating layer ILD include silicon oxide, silicon nitride, and/or silicon oxynitride. These may be used alone or in combination with each other.

In an embodiment, the first to sixth connection electrodes CE1, CE2, CE3, CE4, CE5, and CE6, respectively, may be disposed on the interlayer insulating layer ILD. In an embodiment, the first to sixth connection electrodes CE1, CE2, CE3, CE4, CE5, and CE6, respectively, may be formed of metal, alloy, conductive metal oxide, transparent conductive material, and/or the like. Examples of materials that can be used for the first to sixth connection electrodes CE1, CE2, CE3, CE4, CE5, and CE6, respectively, may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. These may be used alone or in combination with each other.

In an embodiment, the first to sixth connection electrodes CE1, CE2, CE3, CE4, CE5, and CE6, respectfully, may be configured as a single layer and/or as a multilayer combined with each other. For example, the first to sixth connection electrodes CE1, CE2, CE3, CE4, CE5, and CE6, respectively, may include a titanium layer, a copper layer disposed on the titanium layer, and/or indium tin oxide layer disposed on the copper layer. In other words, the first to sixth connection electrodes CE1, CE2, CE3, CE4, CE5, and CE6, respectively, may have a Ti/Cu/ITO structure.

In an embodiment, the first connection electrode CE1 may contact the first active pattern ACT1 and may transmit the data voltage DATA to the first active pattern ACT1. The second connection electrode CE2 may contact the first active pattern ACT1 and the second gate electrode GAT2 and may transfer the data voltage DATA to the second gate electrode GAT2. The third connection electrode CE3 may overlap the second gate electrode GAT2 and may form a capacitor with the second gate electrode GAT2. The fourth connection electrode CE4 may contact the second active pattern ACT2 and may transfer the initialization voltage VINT to the second active pattern ACT2. The fifth connection electrode CE5 may contact the second active pattern ACT2, the lower metal pattern BML, the third active pattern ACT3, and/or the pixel electrode PXE, and/or may transfer the driving current to the pixel electrode PXE. The sixth connection electrode CE6 may contact the third active pattern ACT3 and/or may transfer the first voltage ELVDD to the third active pattern ACT3.

In an embodiment, the passivation layer PVX may be disposed on the interlayer insulating layer ILD, where the passivation layer PVX may cover the first to sixth connection electrodes CE1, CE2, CE3, CE4, CE5, and CE6, respectively.

In an embodiment, the passivation layer PVX may be formed of an inorganic insulating material. Examples of inorganic insulating materials that may be used as the passivation layer PVX may include silicon oxide, silicon nitride, and/or silicon oxynitride. These may be used alone or in combination with each other.

In another embodiment, the passivation layer PVX may be omitted.

In an embodiment, the via pattern VP may be disposed on the passivation layer PVX. In an embodiment, the via pattern VP may be formed of an organic material. Examples of organic materials that can be used for the via pattern VP may include photoresist, polyacrylic resin, polyimide resin, and/or acrylic resin. These may be used alone or in combination with each other.

In another embodiment, the passivation layer PVX may be omitted. In this case, the via pattern VP may include an organic material and an inorganic material. Examples of materials that can be used for the via pattern VP may include photoresist, polyacrylic resin, polyimide resin, acrylic resin, silicon oxide, silicon nitride, and/or silicon oxynitride. These may be used alone or in combination with each other.

Referring to FIG. 6, in an embodiment, the via pattern VP may include a first upper surface US1 and a second upper surface US2. The first upper surface US1 may be defined as an upper surface of the via pattern VP overlapping the first area A1 and may have a first height H1. The second upper surface US2 may be defined as an upper surface of the via pattern VP overlapping the second area A2 and may have a second height H2. The first height H1 may be higher than the second height H2. In other words, the via pattern VP may include upper surfaces having different heights, and the height in the second area A2 may be lower than the height in the first area A1. Accordingly, an accommodation space may be formed in the via pattern VP of the second area A2.

In an embodiment, the pixel electrode PXE may be disposed on the via pattern VP. In an embodiment, the pixel electrode PXE may overlap the first area A1 and the second area A2 and may be disposed along a profile of the via pattern VP. In addition, a contact hole CNT defined in a portion of the second area A2 may be formed in the via pattern VP, and the pixel electrode PXE may contact the fifth connection electrode CE5 through the contact hole CNT. In this case, an upper surface of the pixel electrode PXE contacting the fifth connection electrode CE5 may be positioned lower than the second upper surface US2.

In an embodiment, the pixel electrode PXE may be formed of metal, alloy, conductive metal oxide, transparent conductive material, and or the like. Examples of materials that can be used as the pixel electrode PXE may include silver ("Ag"), an alloy containing silver, molybdenum ("Mo"), an alloy containing molybdenum, aluminum ("Al"), an alloy containing aluminum, aluminum nitride ("AlN"), tungsten ("W'), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. These may be used alone or in combination with each other.

In an embodiment, the pixel electrode PXE may be formed of a single layer and/or multiple layers in combination with each other. For example, the pixel electrode PXE may have an ITO/Ag/ITO structure.

In an embodiment, the pixel defining pattern PDP may be disposed on the pixel electrode PXE and/or may cover an end of the pixel electrode PXE. In an embodiment, the pixel defining pattern PDP may be accommodated by the via pattern VP overlapping the second area A2. As the accommodating space is formed in the via pattern VP and the pixel defining pattern PDP is formed in the accommodating space, the pixel defining pattern PDP may have a sufficient thickness, and/or a step difference between the first upper surface US1 and the pixel defining pattern PDP may be reduced.

In an embodiment, the pixel defining pattern PDP may be formed of an organic material. Examples of organic materials that can be used as the pixel defining pattern PDP may include photoresist, polyacrylic resin, polyimide resin, and/or acrylic resin. These may be used alone or in combination with each other.

In an embodiment, as shown in FIG. 6, when the pixel defining pattern PDP is formed of an organic material having a relatively high viscosity, the pixel defining pattern PDP may have a curvature, and a maximum height of the pixel defining pattern PDP may be higher than the first height H1.

In an embodiment, the common emission layer EL may be disposed on the pixel electrode PXE and the pixel defining pattern PDP. In an embodiment, the common emission layer EL may be formed on the entire area of the display area DA. For example, the common emission layer EL may have a multilayer structure in which a plurality of layers are stacked. The common electrode CTE may be disposed on the common emission layer EL.

In an embodiment and referring back to FIG. 5, the first inorganic layer IL1 may be disposed on the common electrode CTE. In an embodiment, the first inorganic layer IL1 may be formed of an inorganic material. Examples of inorganic materials that may be used as the first inorganic layer IL1 may include silicon oxide, silicon nitride, and/or silicon oxynitride. These may be used alone or in combination with each other.

In an embodiment, the organic layer OL may be disposed on the first inorganic layer IL1. In an embodiment, the organic layer OL may be formed of an organic material. Examples of organic materials that can be used as the organic layer OL may include photoresist, polyacrylic resin, polyimide resin, and/or acrylic resin. These may be used alone or in combination with each other.

In an embodiment, the second inorganic layer IL2 may be disposed on the organic layer OL. In an embodiment, the second inorganic layer IL2 may be formed of an inorganic material. Examples of inorganic materials that can be used as the second inorganic layer IL2 may include silicon oxide, silicon nitride, and/or silicon oxynitride. These may be used alone or in combination with each other.

In accordance with various embodiments, FIGS. 7 to 13 are cross-sectional views illustrating a method of manufacturing the display device of FIG. 6.

Figure 7:
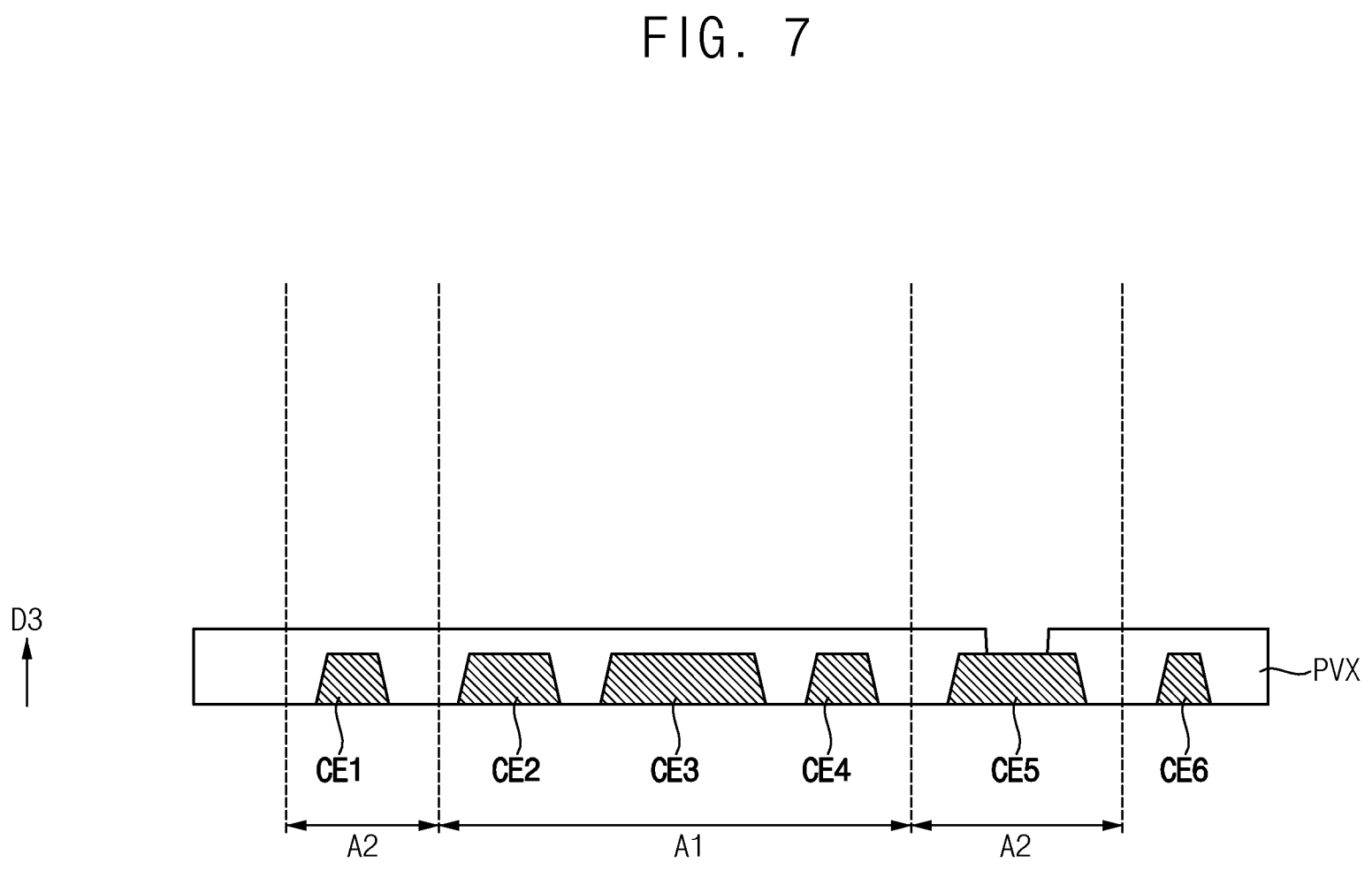

Referring to FIG. 7, in an embodiment, the passivation layer PVX, covering the first to sixth connection electrodes CE1, CE2, CE3, CE4, CE5, and CE6, respectively, and defined a contact hole exposing the fifth connection electrode CE5, may be formed.

Figure 8:
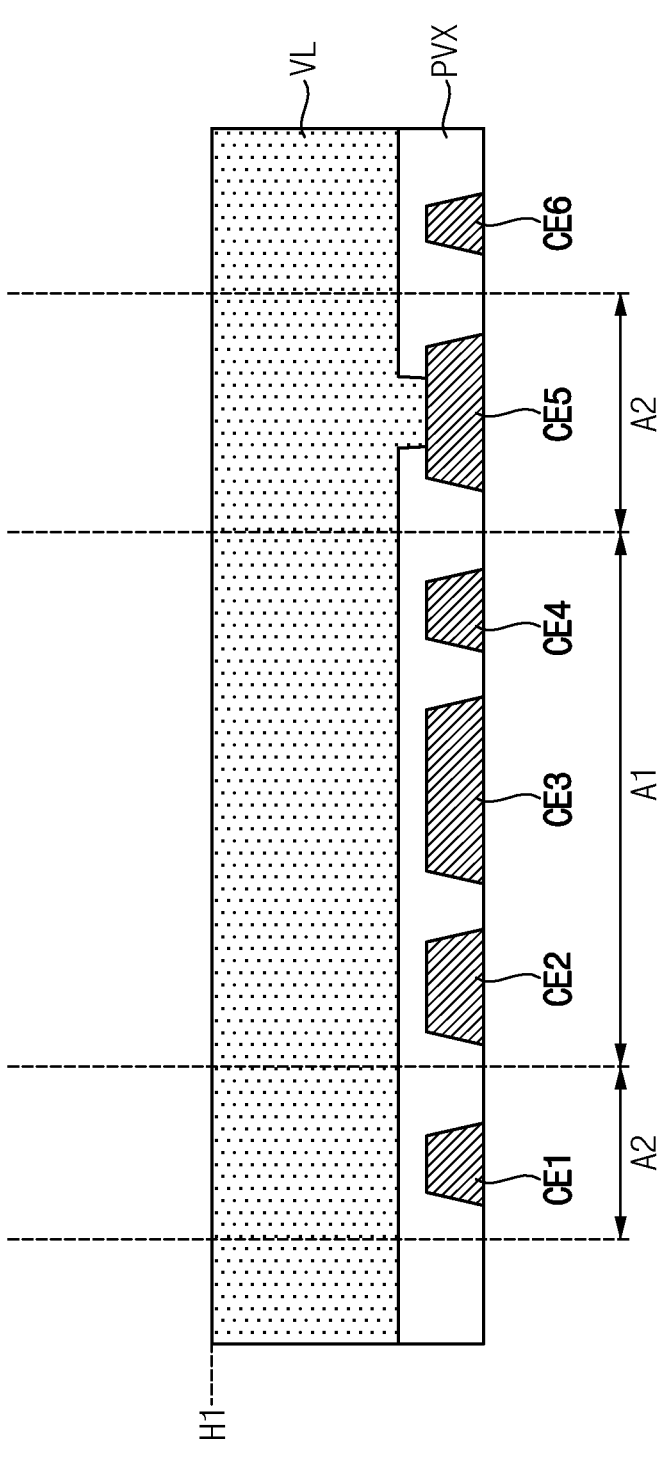
FIG. 8 is a cross-sectional view illustrating a method of manufacturing the display device of FIG. 6 according to an embodiment.

Referring to FIG. 8, in an embodiment, a via layer VL may be coated on the passivation layer PVX, where the via layer VL may be formed of an organic material and/or may have substantially flat upper surfaces in the first area A1 and/or the second area A2.

Figure 9:
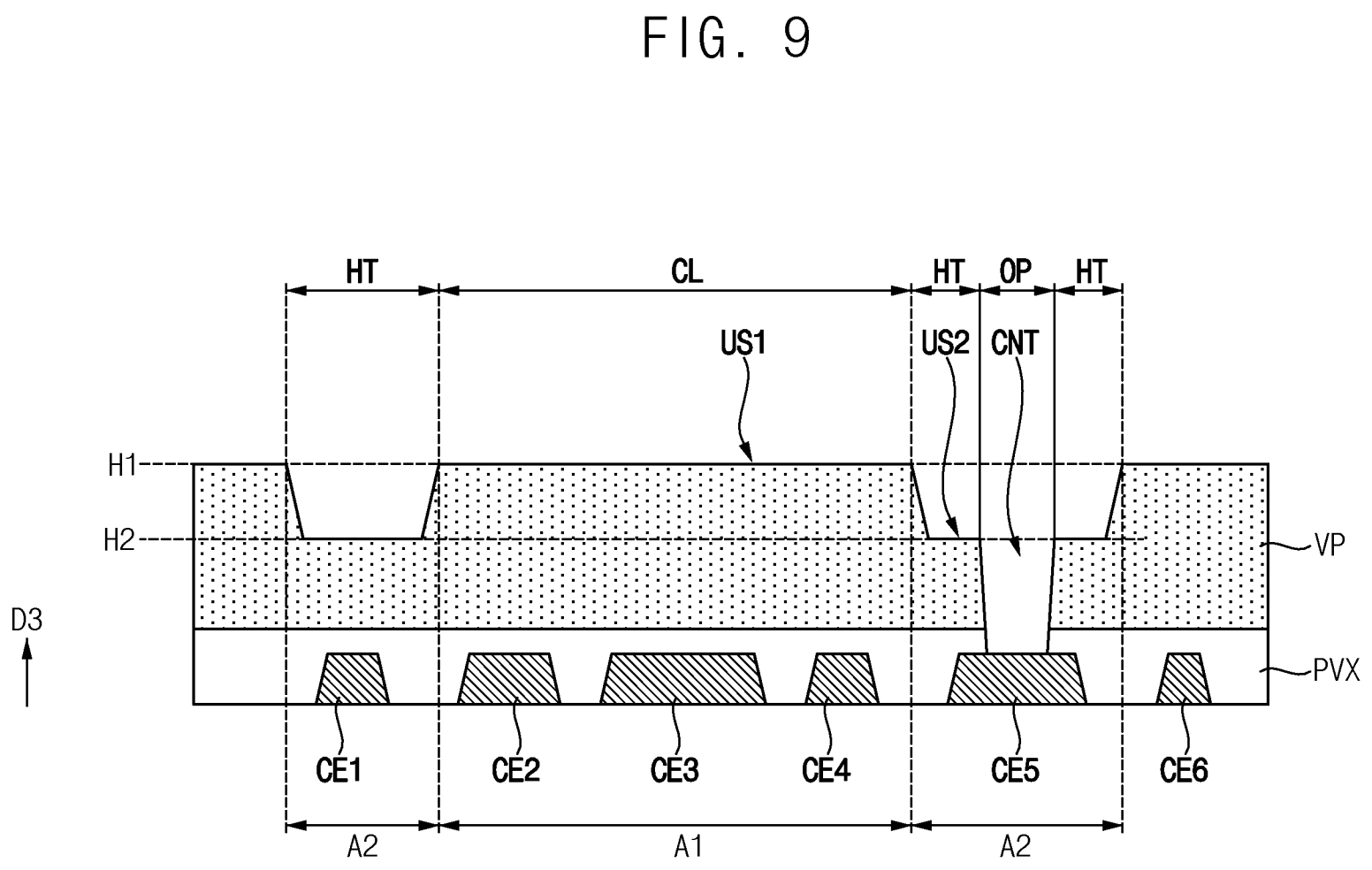

Referring to FIG. 9, in an embodiment, the via pattern VP may be formed by removing a portion of the via layer VL through exposure and/or development processes.

In an embodiment, the via pattern VP may be formed using a halftone mask. For example, the halftone mask may include a blocking area CL, a halftone area HT, and/or an open area OP. The blocking area CL may correspond to the first area A1, the halftone area HT may correspond to the second area A2, and/or the open area OP may correspond to the contact hole CNT. As the blocking area CL blocks ultraviolet rays, the via pattern VP may have the first height H1 in the first area A1. As the halftone area HT partially transmits ultraviolet light, the via pattern VP may have the second height H2 in the second area A2. As the open area OP transmits the ultraviolet light, the contact hole CNT exposing the fifth connection electrode CE5 may be formed in the via pattern VP. Accordingly, the first upper surface US1, the second upper surface US2, and/or the contact hole CNT may be formed together.

Figure 10:
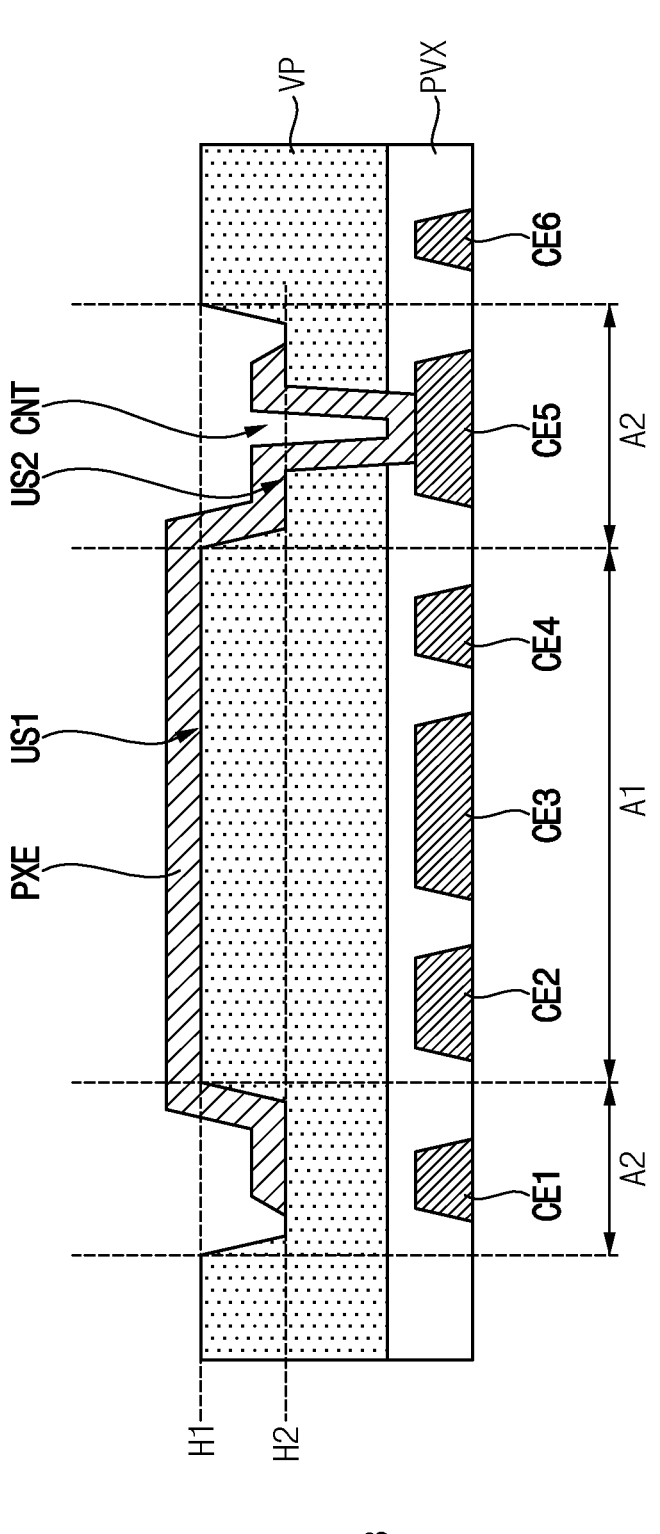
FIG. 10 is a cross-sectional view illustrating a method of manufacturing the display device of FIG. 6 according to an embodiment.

Referring to FIG. 10, in an embodiment, the pixel electrode PXE may be formed in the first area A1 and/or the second area A2. The pixel electrode PXE may contact the fifth connection electrode CE5 in the second area A2 through the contact hole CNT.

Figure 11:
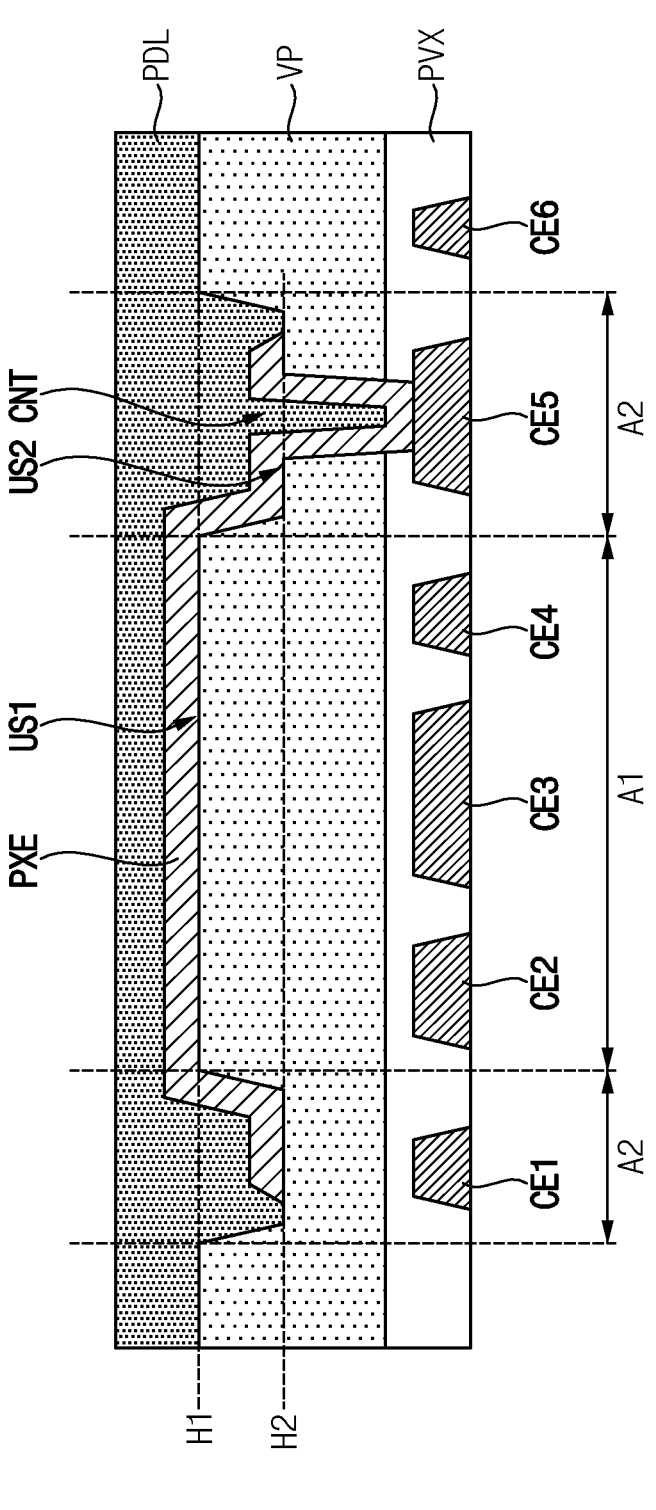
FIG. 11 is a cross-sectional view illustrating a method of manufacturing the display device of FIG. 6 according to an embodiment.

In an embodiment and referring to FIG. 11, a pixel defining layer PDL may be formed on the via pattern VP to entirely cover the pixel electrode PXE. The pixel defining layer PDL may be formed of an organic material and/or may have substantially flat upper surfaces in the first area A1 and/or the second area A2. As the via pattern VP has the relatively low second height H2 in the second area A2, the pixel defining layer PDL may have a sufficient thickness in the second area A2.

Figure 12:
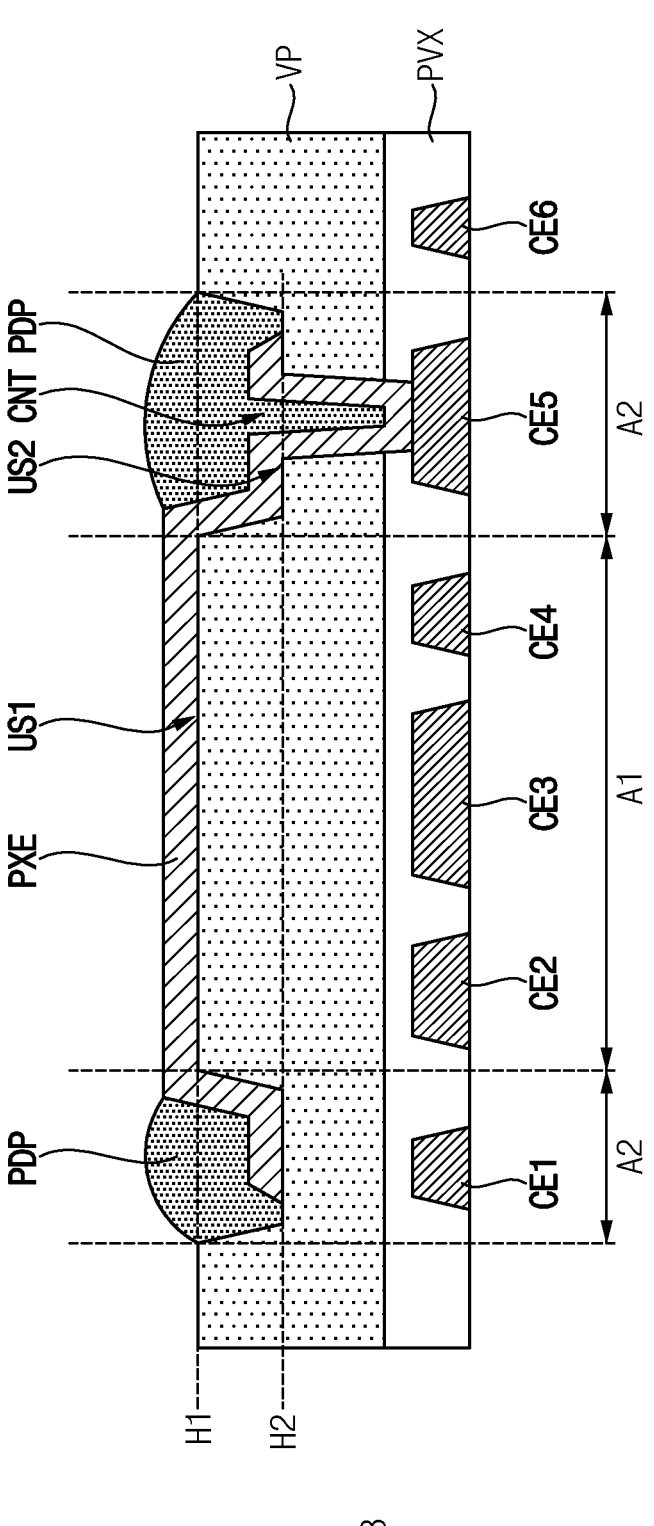
FIG. 12 is a cross-sectional view illustrating a method of manufacturing the display device of FIG. 6 according to an embodiment.

In an embodiment and referring to FIG. 12, an opening exposing the pixel electrode PXE of the first area A1 may be formed in the pixel defining layer PDL. Accordingly, the pixel defining pattern PDP may be accommodated in the via pattern VP overlapping the second area A2. The pixel defining pattern PDP may have a sufficient thickness in the second area A2, and a step difference between the first upper surface US1 and the pixel defining pattern PDP may be reduced.

For example, in an embodiment, a foreign material generated in a process of manufacturing the display device DD (e.g., a process of forming the pixel electrode PXE and the common emission layer EL or the process of bonding the color conversion substrate 2000 to the emission substrate 1000) may be positioned around the pixel defining pattern PDP. In this case, as the step difference between the first upper surface US1 and the pixel defining pattern PDP is reduced, the foreign material positioned around the pixel defining pattern PDP may be easily removed.

Figure 13:
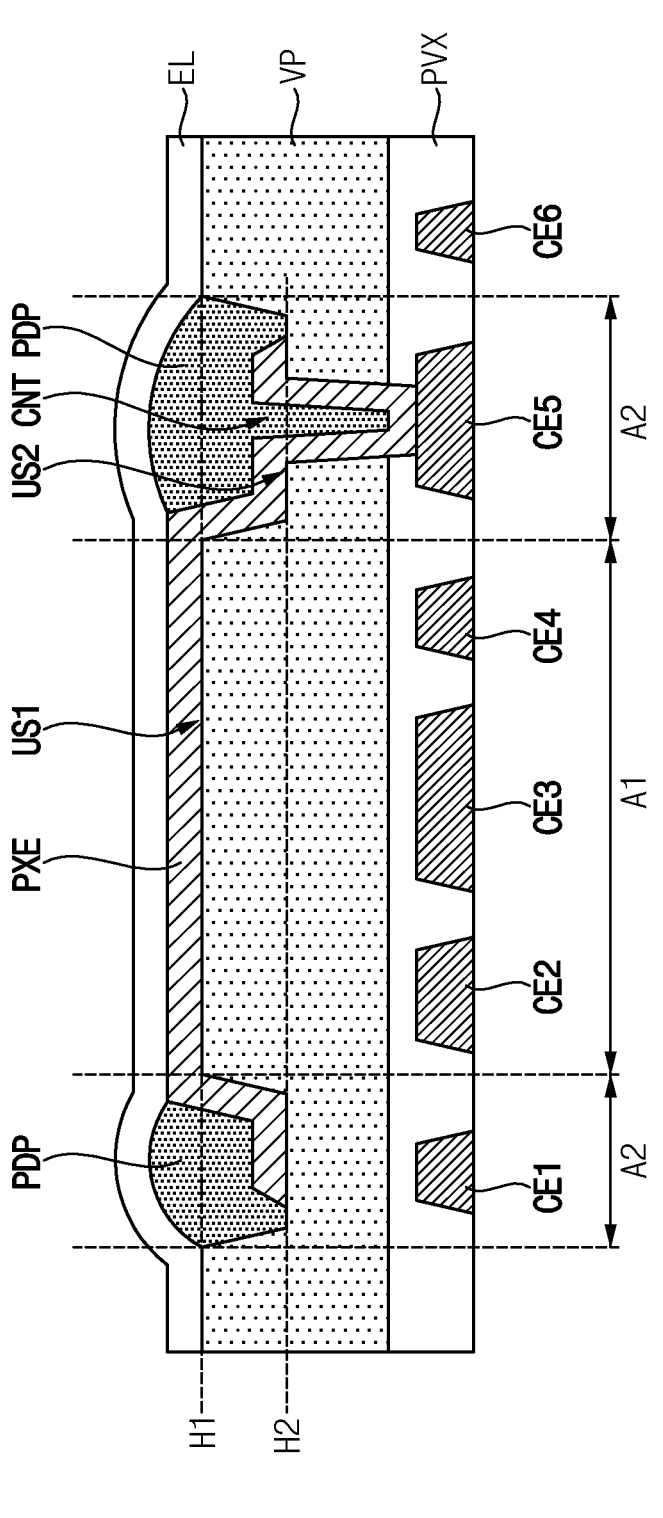
FIG. 13 is a cross-sectional view illustrating a method of manufacturing the display device of FIG. 6 according to an embodiment.

In an embodiment, referring to FIG. 13, the common emission layer EL may be formed on the pixel electrode PXE and the pixel defining pattern PDP.

Figure 14:
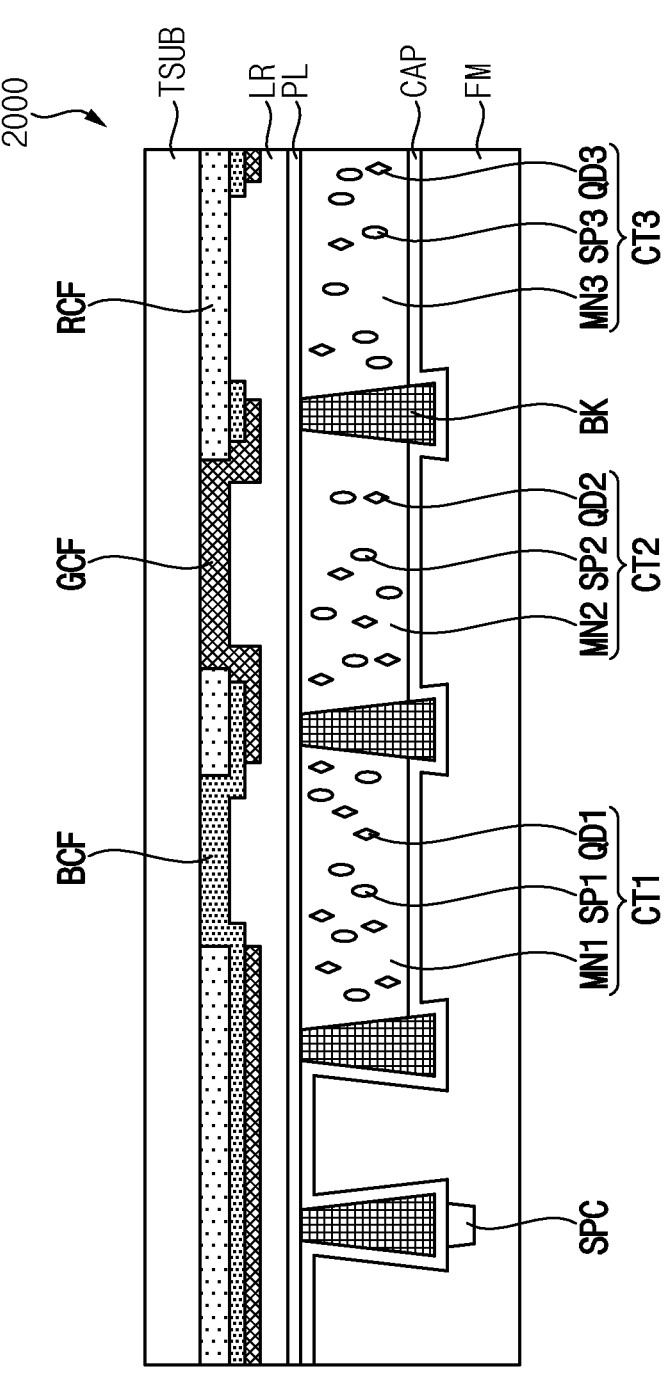
FIG. 14 is a cross-sectional view illustrating a color conversion substrate included in the display device of FIG. 1 according to an embodiment.

In an embodiment and referring to FIG. 14 is a cross-sectional view illustrating a color conversion substrate included in the display device of FIG. 1.

In an embodiment and referring to FIG. 14, the color conversion substrate 2000 may include an upper substrate TSUB, a first color filter BCF, a second color filter GCF, a third color filter RCF, a refraction layer LR, a protective layer PL, a partition wall BK, a first color conversion pattern CT1, a second color conversion pattern CT2, a third color conversion pattern CT3, a capping layer CAP, a spacer SPC, and a filler FM.

In an embodiment, the upper substrate TSUB may include a transparent and/or opaque material. In an embodiment, examples of materials that can be used as the upper substrate TSUB may include glass, quartz, and/or plastic. These may be used alone or in combination with each other. In addition, the upper substrate TSUB may be composed of a single layer and/or multiple layers in combination with each other.

In an embodiment, the first color filter BCF may be disposed under the upper substrate TSUB. In an embodiment, the first color filter BCF may transmit only light having a wavelength band corresponding to blue. For example, the first color filter BCF may include photoresist, acrylic resin, epoxy resin, and/or polyimide resin, and may be patterned through the above-described exposure process.

In an embodiment, the second color filter GCF may be disposed under the upper substrate TSUB. In an embodiment, the second color filter GCF may transmit only light having a wavelength band corresponding to green. For example, the second color filter GCF may include photoresist, acrylic resin, epoxy resin, and/or polyimide resin, and may be patterned through the above-described exposure process.

In an embodiment, the third color filter RCF may be disposed under the upper substrate TSUB. In an embodiment, the third color filter RCF may transmit only light having a wavelength band corresponding to red. For example, the third color filter RCF may include photoresist, acrylic resin, epoxy resin, and/or polyimide resin, and may be patterned through the above-described exposure process.

In an embodiment, the refraction layer LR may be disposed under the first to third color filters BCF, GCF, and RCF, respectively. The refraction layer LR may entirely cover the first color filter BCF, the second color filter GCF, and/or the third color filter RCF. In an embodiment, the refraction layer LR may include a material having a relatively low refractive index (or a material having a relatively high refractive index).

In an embodiment, the protective layer PL may be entirely disposed under the refraction layer LR. In an embodiment, the protective layer PL may include an inorganic material.

For example, the protective layer PL may be formed of silicon oxide ("$SiO_2$"), silicon nitride ("$SiN_x$"), silicon oxynitride ("SiON"), aluminum oxide ("$Al_2O_3$"), titanium dioxide ("$TiO_2$"), tantalum dioxide ("$Ta_2O_5$"), hafnium dioxide ("$HfO_2$"), and/or zinc dioxide ("$ZnO_2$").

In an embodiment, the partition wall BK may be disposed on the protective layer PL. In an embodiment, the partition wall BK may include a light blocking material that blocks or absorbs light. For example, the partition wall BK may include black pigment, black dye, chromium ("Cr"), chromium oxide ("$CrO_x$"), chromium nitride ("$CrN_x$"), graphite, and/or the like.

In an embodiment, the first color conversion pattern CT1 may be disposed on the protective layer PL. In an embodiment, the first color conversion pattern CT1 may overlap the first color filter BCF and/or may be accommodated by the partition wall BK.

In an embodiment, the first color conversion pattern CT1 may include a first monomer MN1, a first quantum dot QD1, and/or a first scattering particle SP1.

In an embodiment, the first quantum dot QD1 and/or the first scattering particle SP1 may be dispersed in the first monomer MN1. In an embodiment, the first monomer MN1 may include an epoxy-based monomer and/or an ester-based monomer.

In an embodiment, the first quantum dot QD1 may convert the color of incident light to blue. For example, the first quantum dot QD1 may be a quantum dot, and may be selected from a group consisting of a group II-VI compound, a group IV-VI compound, a group IV element, a group IV compound, and/or combinations thereof. In another embodiment, the first color conversion pattern CT1 may not include the first quantum dot QD1.

In an embodiment, the first scattering particles SP1 may scatter light. In an embodiment, the first scattering particles SP1 may include titanium dioxide ("$TiO_2$") particles, zinc oxide ("ZnO") particles, aluminum oxide ("$Al_2O_3$") particles, silicon oxide ("$SiO_2$") particles, hollow silica particles, and/or the like.

In an embodiment, the second color conversion pattern CT2 may be disposed on the protective layer PL. In an embodiment, the second color conversion pattern CT2 may overlap the second color filter GCF and/or may be accommodated by the partition wall BK.

In an embodiment, the second color conversion pattern CT2 may include a second monomer MN2, a second quantum dot QD2, and/or a second scattering particle SP2.

In an embodiment, the second quantum dots QD2 and/or the second scattering particles SP2 may be dispersed in the second monomer MN2. In an embodiment, the second monomer MN2 may include an epoxy-based monomer and/or an ester-based monomer.

In an embodiment, the second quantum dot QD2 may convert the color of incident light to green. For example, the second quantum dot QD2 may be a quantum dot, and/or may be selected from a group consisting of a group II-VI compound, a group IV-VI compound, a group IV element, a group IV compound, and/or combinations thereof.

In an embodiment, the second scattering particles SP2 may scatter light. In an embodiment, the second scattering particles SP2 may include titanium dioxide ("$TiO_2$") particles, zinc oxide ("ZnO") particles, aluminum oxide ("$Al_2O_3$") particles, silicon oxide ("$SiO_2$") particles, hollow silica particles, and/or the like.

In an embodiment, the third color conversion pattern CT3 may be disposed on the protective layer PL. In an embodiment, the third color conversion pattern CT3 may overlap the third color filter RCF and/or may be accommodated by the partition wall BK.

In an embodiment, the third color conversion pattern CT3 may include a third monomer MN3, a third quantum dot QD3, and/or a third scattering particle SP3.

In an embodiment, the third quantum dot QD3 and/or the third scattering particle SP3 may be dispersed in the third monomer MN3. In an embodiment, the third monomer MN3 may include an epoxy-based monomer and/or an ester-based monomer.

In an embodiment, the third quantum dot QD3 may convert the color of incident light to red. For example, the third quantum dot QD3 may be a quantum dot, and/or may be selected from a group consisting of a group II-VI compound, a group IV-VI compound, a group IV element, a group IV compound, and/or combinations thereof.

In an embodiment, the third scattering particles SP3 may scatter light. In an embodiment, the third scattering particles SP3 may include titanium dioxide ("$TiO_2$") particles, zinc oxide ("ZnO") particles, aluminum oxide ("$Al_2O_3$") particles, silicon oxide ("$SiO_2$") particles, hollow silica particles, and/or the like.

In an embodiment, the capping layer CAP may be disposed on the first to third color conversion patterns CT1, CT2, and CT3, respectively. The capping layer CAP may entirely cover the first to third color conversion patterns CT1, CT2, and CT3, respectively.

In an embodiment, the spacer SPC may be disposed on the partition wall BK.

In an embodiment, the filler FM may be disposed on the capping layer CAP. In an embodiment, the filler FM may include air and/or an organic material having a relatively high refractive index. For example, the filler FM may include a urethane-based resin, an epoxy-based resin, and/or an acrylic-based resin.

Figure 15:
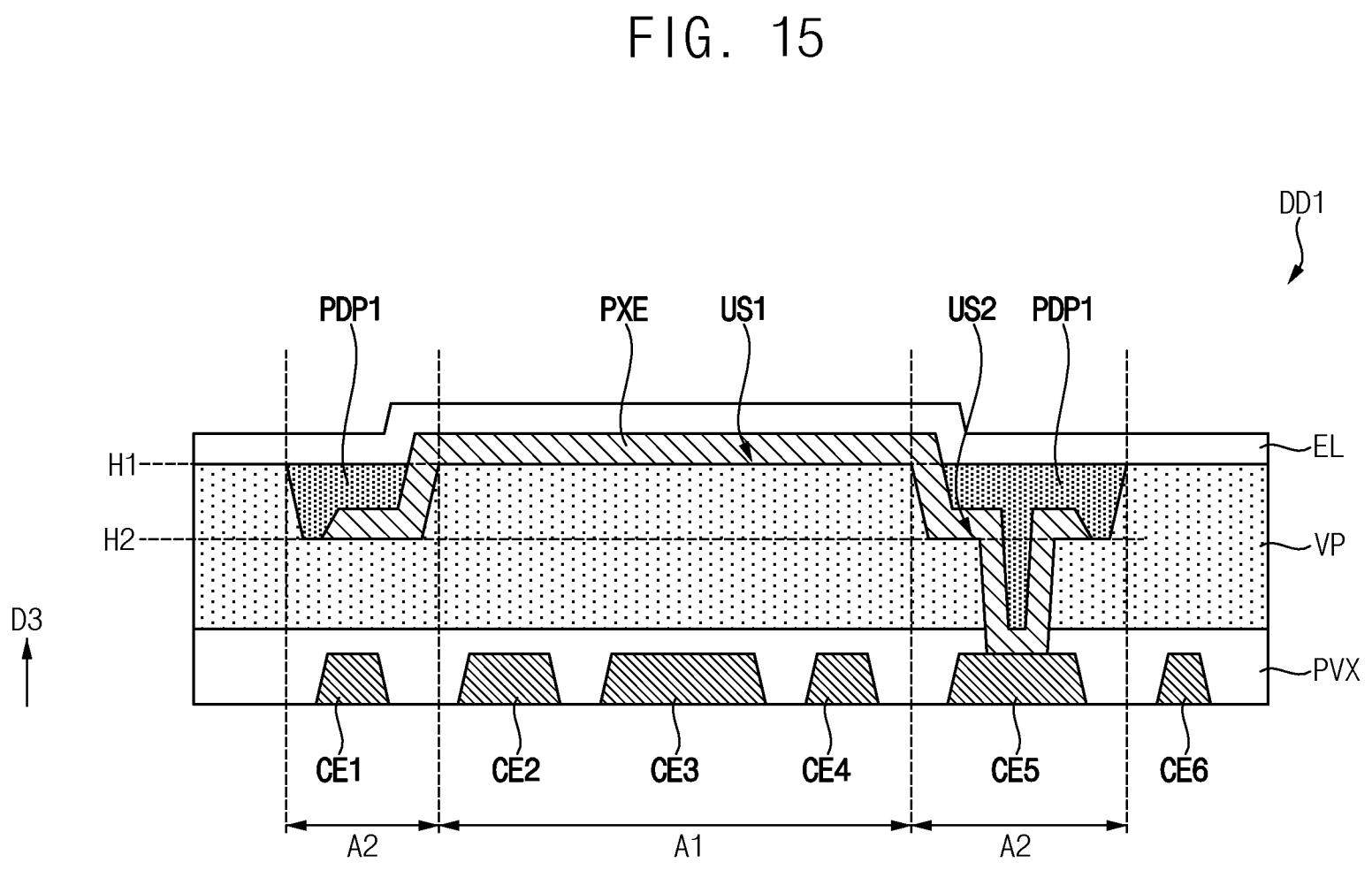

FIG. 15 is a cross-sectional view illustrating a display device according to another embodiment.

In an embodiment and referring to FIG. 15, a display device DD1 according to another embodiment may include the first to sixth connection electrodes CE1, CE2, CE3, CE4, CE5, and CE6, respectively, the passivation layer PVX, the via pattern VP, the pixel electrode PXE, a pixel defining pattern PDP1, and/or the common emission layer EL. However, the display device DD1 may be substantially the same as the display device DD described above with reference to FIG. 6, except for the pixel defining pattern PDP1.

In an embodiment, when the pixel defining pattern PDP1 is formed of an organic material having a relatively low viscosity, the pixel defining pattern PDP1 may have the first height H1 and/or may be flatly accommodated in the via pattern VP.

Figure 16:
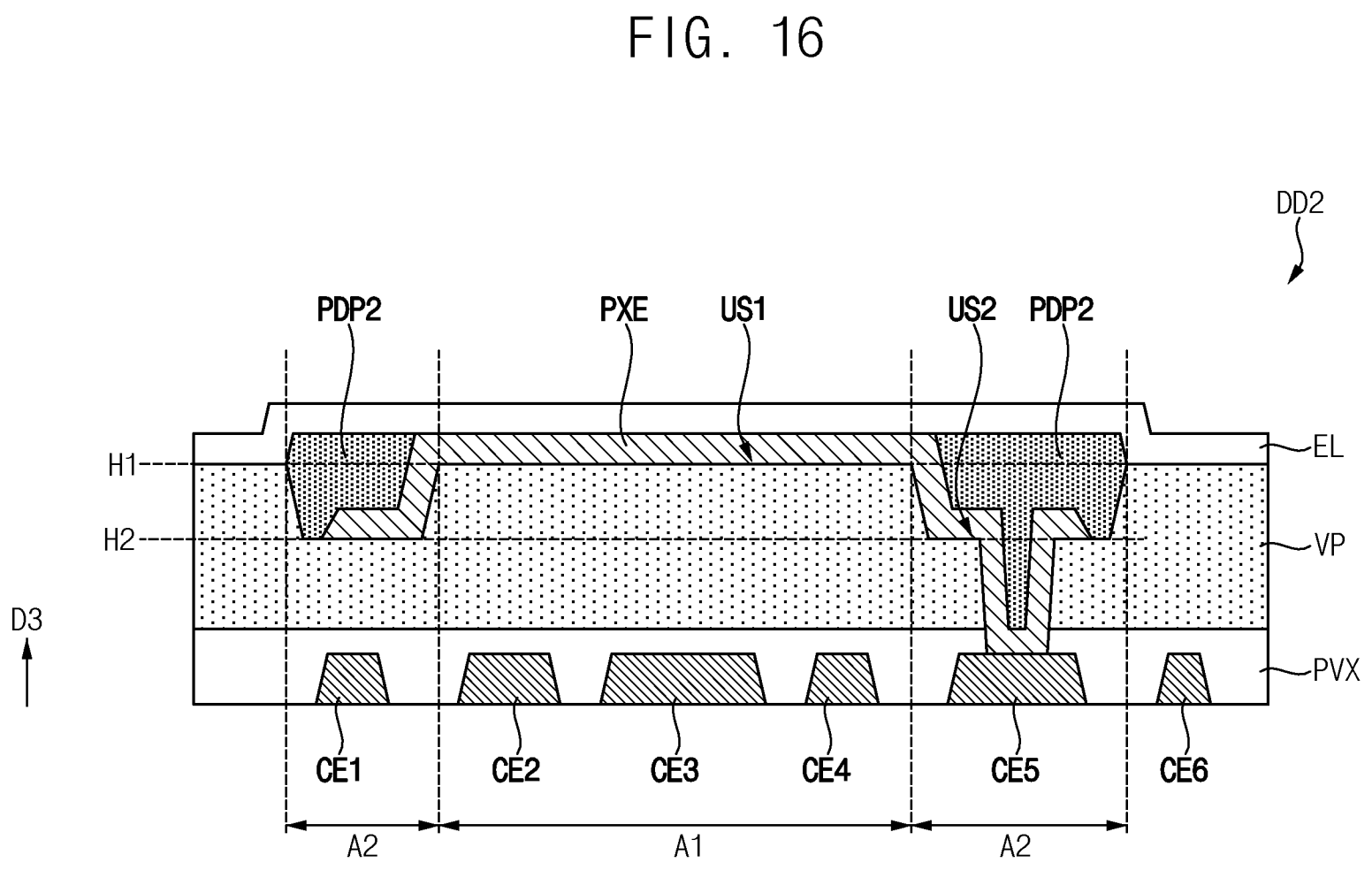

FIG. 16 is a cross-sectional view illustrating a display device according to still another embodiment.

In an embodiment and referring to FIG. 16, the display device DD2 according to still yet another embodiment may include the first to sixth connection electrodes CE1, CE2, CE3, CE4, CE5, and CE6, respectively, the passivation layer PVX, the via pattern VP, the pixel electrode PXE, a pixel defining pattern PDP2, and/or the common emission layer EL. However, the display device DD2 may be substantially the same as the display device DD described above with reference to FIG. 6, except for the pixel defining pattern PDP2.

In an embodiment, when the pixel defining pattern PDP1 is formed of an organic material having a relatively low viscosity, the pixel defining pattern PDP1 may have a height higher than the first height H1, and may be flatly accommodated in the via pattern VP.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims. Moreover, the embodiments or parts of the embodiments may be combined in whole or in part without departing from the scope of the invention.

What is claimed is:

1. A display device comprising:
a connection electrode disposed on a substrate;
a via pattern disposed on the connection electrode, wherein the via pattern includes a first height in a first area and a second height in a second area, wherein the second area surrounds the first area and wherein the second height is lower than the first height;
a pixel electrode disposed on the via pattern and contacting the connection electrode in the second area; and
a pixel defining pattern disposed on the pixel electrode and disposed in the via pattern overlapping the second area.

2. The display device of claim 1, wherein the first area has a polygonal shape, and
wherein the second area completely surrounds the first area.

3. The display device of claim 2, wherein the first area has an octagonal shape.

4. The display device of claim 1, wherein the via pattern includes:
a first upper surface having the first height; and
a second upper surface having the second height, and
wherein an upper surface of the pixel electrode contacts the connection electrode and is positioned lower than the second upper surface.

5. The display device of claim 1, wherein the pixel electrode contacts the connection electrode through a contact hole penetrating the via pattern, and
wherein the contact hole is defined in a portion of the second area.

6. The display device of claim 1, wherein the pixel defining pattern has a curvature, and
wherein a maximum height of the pixel defining pattern is higher than the first height.

7. The display device of claim 1, wherein the pixel defining pattern has a height equal to the first height and is flatly disposed in the via pattern.

8. The display device of claim 1, wherein the pixel defining pattern has a height higher than the first height and is flatly disposed in the via pattern.

9. The display device of claim 1, further comprising:
a common emission layer disposed on the pixel electrode and the pixel defining pattern.

10. The display device of claim 1, further comprising:

a lower metal pattern disposed on the substrate; and an active pattern disposed on the lower metal pattern.

11. The display device of claim 1, further comprising:

a conversion substrate disposed to face the substrate.

12. A method of manufacturing a display device, the method comprising:

forming a connection electrode on a substrate;

forming a via layer on the connection electrode, wherein the via layer includes a first area and a second area surrounding the first area;

forming a contact hole which penetrates the via layer to expose the connection electrode in the second area;

forming a via pattern by partially removing the via layer, wherein a first height of the first area is higher than a second height of the second area;

forming a pixel electrode contacting the connection electrode in the second area; and forming a pixel defining pattern disposed in the via pattern to overlap the second area.

13. The method of claim 12, wherein the contact hole and the via pattern are formed together.

14. The method of claim 13, wherein the via pattern is formed using a halftone mask.

15. The method of claim 14, wherein the halftone mask includes:

a blocking area corresponding to the first area;

an open area corresponding to the contact hole; and a halftone area corresponding to the second area.

16. The method of claim 12, wherein forming the pixel defining pattern includes:

forming a pixel defining layer to entirely cover the pixel electrode disposed on the via pattern; and forming an opening which exposes the pixel electrode of the first area in the pixel defining layer.

17. The method of claim 12, further comprising:

forming a common emission layer on the pixel electrode and the pixel defining pattern.

18. The method of claim 12, further comprising:

bonding a color conversion substrate, wherein the color conversion substrate is disposed to face the substrate.

19. A display device comprising:

a connection electrode disposed on a substrate;

a via pattern disposed on the connection electrode, wherein the via pattern includes a first height in a first area and a second height in a second area, wherein the second area surrounds the first area and wherein the second height is lower than the first height;

a pixel electrode disposed on the via pattern and contacting the connection electrode in the second area;

a pixel defining pattern disposed on the pixel electrode and disposed in the via pattern overlapping the second area, wherein the first area is completely surrounded by the second area and wherein the first area is at least one of, a polygonal shape, and an octagonal shape.

20. The display device of claim 19, wherein the via pattern includes, a first upper surface having the first height; and a second upper surface having the second height, and wherein an upper surface of the pixel electrode contacts the connection electrode and is positioned at a height lower than the second upper surface.

\* \* \* \* \*